United States Patent [19]

Warwick

[11] Patent Number: 5,668,538
[45] Date of Patent: Sep. 16, 1997

[54] MODULAR ELECTRICITY METER ARRANGEMENT HAVING REMOTELY CONTROLLABLE SWITCH

[75] Inventor: Ronald Warwick, Liverpool, England

[73] Assignee: Siemens Measurements Limited, Oldham, England

[21] Appl. No.: 566,289

[22] Filed: Dec. 1, 1995

[30] Foreign Application Priority Data

Dec. 3, 1994 [GB] United Kingdom ............... 9424461

[51] Int. Cl.$^6$ ............................................. G08B 23/00
[52] U.S. Cl. ........................ 340/870.02; 340/870.07; 340/870.16; 340/825.07; 364/492; 307/140
[58] Field of Search ............... 340/870.02, 870.03, 340/870.07, 870.05, 870.16, 870.28, 870.3, 870.31, 870.32, 870.39, 637, 688, 693, 310.01, 310.08, 825.07; 364/483, 492, 493; 307/116, 132 E, 132 EA, 139, 140, 143

[56] References Cited

FOREIGN PATENT DOCUMENTS

| | | |
|---|---|---|
| 1 204 111 | 9/1970 | United Kingdom . |
| 2087572 | 5/1982 | United Kingdom . |
| 2272530 | 5/1994 | United Kingdom . |

*Primary Examiner*—Jeffery Hofsass
*Assistant Examiner*—Andrew Hill
*Attorney, Agent, or Firm*—Keck, Mahin & Cate

[57] ABSTRACT

An electricity meter includes input terminals to which, in use, a main electricity supply is connected, output terminals via which, in use, electricity is fed to a consumer, a switch via which electricity is fed from the input terminals to the output terminals and an indicating device operative to provide an indication of the quantity of electricity fed via the switch to the consumer. The meter is adapted to receive a unit arranged in operative association with the switch so as to effect operation of a switch actuator to open the switch for the purpose of interrupting the supply of electricity to the consumer consequent upon receipt by the unit of a predetermined actuation signal.

17 Claims, 9 Drawing Sheets

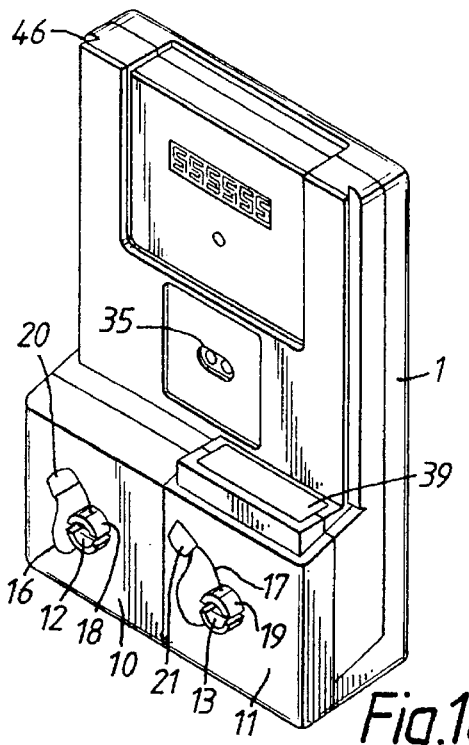
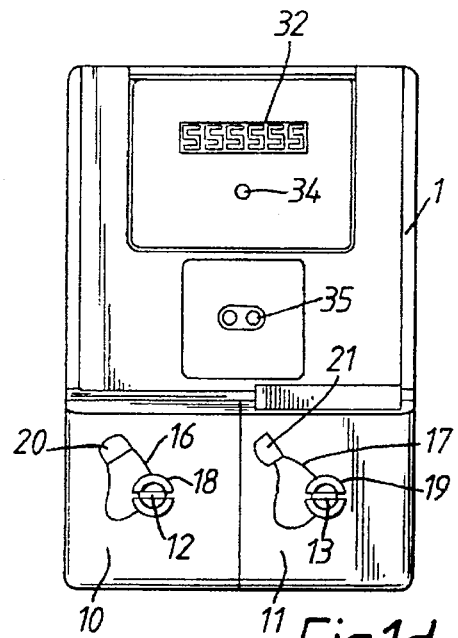
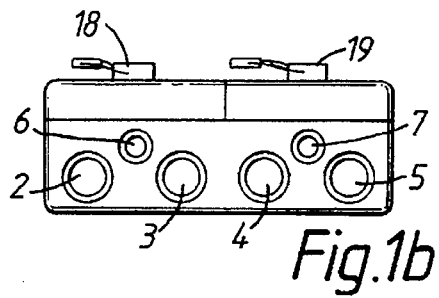
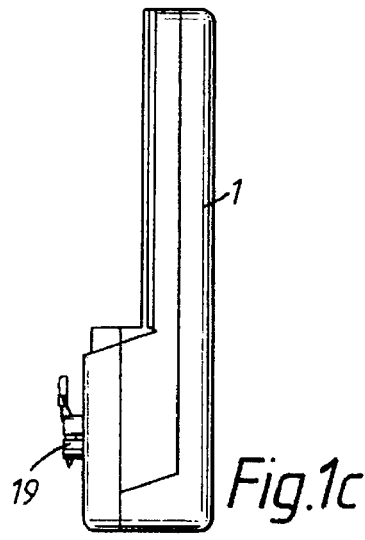
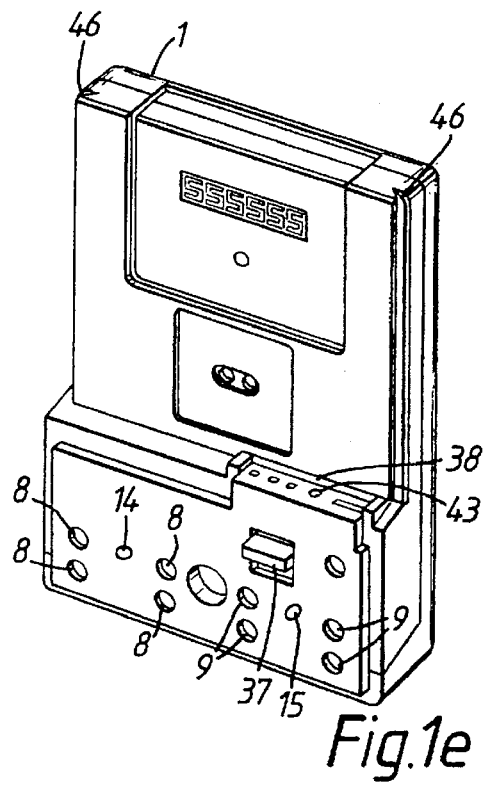

MODULAR ELECTRICITY METER ARRANGEMENT HAVING REMOTELY CONTROLLABLE SWITCH

BACKGROUND OF THE INVENTION

1. Field of the Invention

This invention relates to electricity meters and more especially but not exclusively it relates to electricity meters for use by domestic consumers.

2. Description of Related Art

A standard electricity credit meter for domestic consumers simply provides a read-out of electricity used. Such meters are read periodically by a meter reader and a bill for the electricity used is sent to the consumer.

Alternatively, a pre-payment meter may be provided for domestic consumers which is arranged to provide a predetermined quantity of electricity to a value corresponding to the value of coins or tokens inserted into the meter.

Further alternatives comprise meters which are arranged to be interrogated remotely via a line link or a radio link for billing purposes and/or meters which can be controlled remotely for effecting tariff changes or for switching the supply on or off in accordance with the time of the day for example.

In these latter cases, a separate dedicated supply may be provided which is controlled remotely or in accordance with signals provided locally by means of a clock.

For the foregoing and other uses, different meters are available, each designed and constructed to suit the particular application in view. It is apparent that in order to provide for possibilities a wide range of different meters are required. With known meters, this requirement has a number of attendant disadvantages, including the high cost of changing from one meter system to another as well as the cost involved in fabricating different meters for different purposes which may each have the same basic functionality.

SUMMARY OF THE INVENTION

It is an object of the present invention to provide a versatile meter in which the aforesaid disadvantages are at least partly obviated.

According to the present invention an electricity meter comprises input terminals to which in use a mains electricity supply is connected, output terminals via which in use electricity is fed to a consumer, a switch via which electricity is fed from the input terminals to the output terminals and metering means operative to provide an indication of the quantity of electricity fed via the switch to the consumer, the meter being adapted to receive a unit arranged in operative association with the switch so as to effect operation of a switch actuator to open the switch for the propose of interrupting the supply of electricity to the consumer consequent upon receipt by the unit of a predetermined actuation signal.

The switch actuator may form a part of the unit and may be arranged to co-operate mechanically with a switch assembly in the meter of which the switch forms a part, so as to effect operation of the switch consequent upon receipt by the unit of said actuation signal.

The switch actuator may be responsive to a further predetermined signal (which may simply be generated by removal of the said predetermined actuation signal), for effecting switch operation so that the supply is connected/re-connected to the consumer.

The unit may be adapted to convert the meter to a pre-payment meter and may be arranged to receive coins or tokens or the like, in dependence upon the provision of which coins or tokens, electricity is supplied via the switch to the consumer, the unit being arranged to deliver the actuation signal to effect switch operation for the purpose of interrupting the supply of electricity to the consumer when a quantity of electricity appropriate to the value of coins or tokens received has been used by the consumer.

The unit may be electrically coupled to the meter for the purpose of receiving signals therefrom indicative of the quantity of electricity used.

Alternatively, the unit may be optically coupled to the meter for the purpose of receiving signals therefrom indicative of the quantity of electricity used.

The unit may have a display which provides an indication of electricity supplied to the consumer as measured by the meter.

Alternatively, the unit may have its own display and measurement facilities.

As a further alternative the unit may be adapted to facilitate the use of a display which forms a part of the meter for providing an indication of the quantity of electricity used by a consumer.

The unit may be arranged to facilitate remote meter reading.

The unit may include for the purpose of facilitating remote meter reading a line communication interface or alternatively a radio communication interface.

Alternatively or additionally, a line communication interface or alternatively a radio communication interface may be provided for effecting remote operation of the meter switch. Thus, it may be arranged that when payment tokens are purchased or, an outstanding bill paid, for example at a central office or showroom, the meter switch can be substantially immediately operated to connect or re-connect a supply.

The unit may include a further switch via which additional output terminals are fed which further switch may be operated remotely.

Alternatively the further switch may be locally controlled as by means of a clock.

It will be appreciated, that by providing a meter which includes a switch, to which meter additional unit(s) may optionally be fitted to operate the switch, a particularly cost effective and versatile meter may be provided in which installation expenses are minimised since additional functionality may be afforded quite simply by adding a unit to suit the function required, and whereby construction costs can be reduced by for example arranging that basic meter functionality is contained within the meter only.

BRIEF DESCRIPTION OF THE DRAWINGS

Some embodiments of the invention will now be described by way of example only with reference to the accompanying drawings, in which, FIG. 1a is an isometric view of an electricity meter;

FIG. 1b is a bottom view of the electricity meter shown in FIG. 1a;

FIG. 1c is a side view of the meter shown in FIGS. 1a and 1b;

FIG. 1d is a front view of the meter shown in FIG. 1a;

FIG. 1e is an isometric view of a part of the meter shown in FIG. 1a;

FIG. 2b is a bottom view of the assembly shown in FIG. 2a;

FIG. 2c is a side view of the assembly shown in FIG. 2a;

FIG. 2d is a front view of the assembly shown in FIG. 2a;

FIG. 2e is a front perspective view of a module forming part of the assembly shown in FIG. 2a;

FIG. 4a is a front view of a meter which corresponds largely to the meter shown in FIG. 1a;

FIG. 5b is a rear isometric view of the assembly shown in FIG. 5 a;

FIG. 5c is a bottom view of the assembly shown in FIG. 5a.

FIG. 5d is a side view of the assembly shown in FIG. 5a;

FIG. 5f is a front perspective view of a module which form a part of the assembly shown in FIGS. 5a to 5e, and, FIG. 5g is a generally schematic block circuit diagram of the module shown in FIG. 5a.

DESCRIPTION OF THE PREFERRED EMBODIMENTS

Figure 1F:
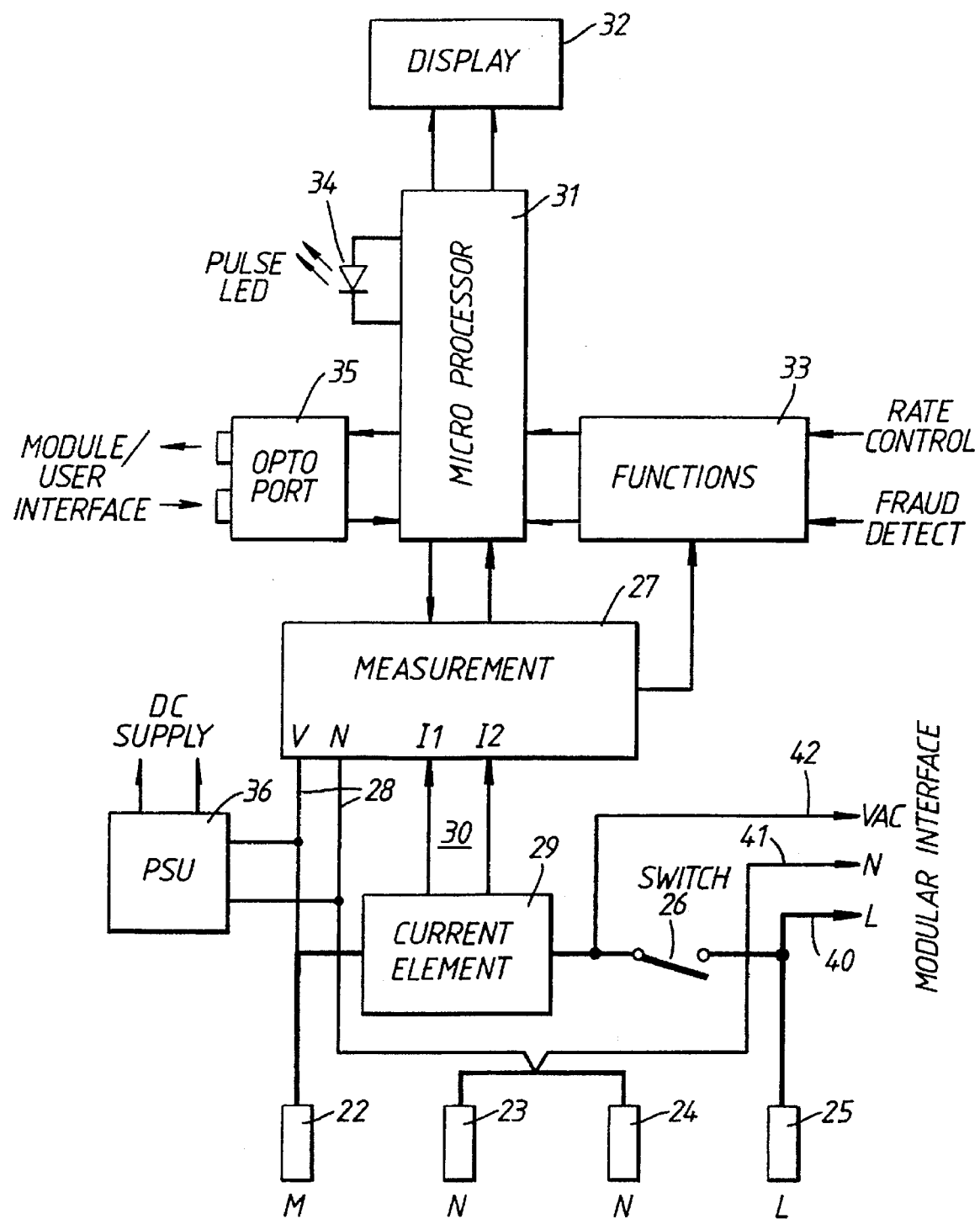
FIG. 1f is a block schematic circuit diagram of the meter as shown in FIGS. 1a to 1e.

Referring now to FIGS. 1a to 1e wherein corresponding parts of the various Figures bear where appropriate the same numerical designations, an electricity meter comprises a housing 1 which includes apertures 2 and 3 for input conductors from a mains supply and apertures 4 and 5 for output conductors which supply electricity to a consumer. Additional apertures 6 and 7 are provided for earth conductors. Terminals for securing the conductors are provided within the housing 1, which embody conductor fixing screws 8 and 9, as shown in FIG. 1e, which are arranged to be accessible externally of the housing 1 for conductor fixing or removal purposes. The screws 8 which are used to secure the mains input conductors are covered with a cover 10 and similarly the screws 9 which are used to secure the output conductors are covered by means of a cover 11. The covers 10 and 11 are held in place by means of fixing screws 12 and 13 which engage complementary tapped holes 14 and 15 respectively. The covers 10 and 11 are sealed in place by means of wires 16 and 17 which pass through upstanding collars 18 and 19 respectively, which form a part of the covers 10 and 11. In order to prevent tampering, the wires 16 and 17 are sealed in position by means of seals 20 and 21. As shown in the circuit diagram of FIG. 1f, the meter housing contains apparatus comprising input terminals 22 and 23 for the mains input conductors, and output terminals 24 and 25 which are arranged to feed electricity to a consumer from the input terminals 22 and 23 via a switch 26. In order to measure the power consumed, signals appertaining to the supply voltage are fed to a measurement circuit 27 via conductors 28 and signals appertaining to the current supplied which is developed in a current sensing element 29, connected in series with the switch 26, are fed to the measurement circuit 27 via conductors 30. Output signals from the measurement circuit 27 are fed to a micro processor 31 which feeds a digital display 32. The micro processor 31 is fed also from a miscellaneous functions circuit 33 which may receive external signals appertaining to rate control and/or fraud detection, for example. Output signals from the micro processor 31 are fed to an LED 34 and omnidirectionally to an opto input and output port 35 which serves as a user interface via which information in the form of light signals may be extracted from the micro processor 31 or injected into the micro processor 31 for various purposes. In order to provide power for the measurement circuit 27, the miscellaneous functions circuit 33, the micro processor 31 and the display 32, a dc power supply 36 is provided which is fed from the conductors 28.

The switch 26 forms part of a switch assembly which includes an actuator 37, as shown in FIG. 1e, which facilitates manual operation of the switch 26 when the cover 11 is removed. As shown in FIG. 1e, an access port 38 is provided in the housing which is normally closed by means of a cover 39 (FIG. 1a), the cover 39 being held in position by the cover 11. The port 38 provides access to live neutral and switch conductors 42, 41 and 40 respectively, as shown in FIG. 1f, via an electrical socket connector (shown in FIG. 2f), and an access aperture 43 for a switch actuator pin 49 as will hereinafter be described with reference to FIG. 2f.

Although the meter thus far described may be used alone as a standard credit meter, with the port cover 39 (FIG. 1a) in position, it may be alternatively used in association with various modules to provide a meter assembly which has additional functionality.

One such module which may either comprise a prepayment module or a telephone module as will now be described with reference to FIGS. 2a to 2h, wherein parts corresponding to the meter shown in FIG. 1a bear the same numerical designations.

Referring now to FIG. 2a to 2d, a meter assembly comprises the meter housing 1, as shown also in FIG. 1a, having fitted thereto a module 44 which is formed to include dove tail slots 45 which cooperate with corresponding dove tail portions 46 of the meter as shown in FIG. 1a and FIG.

1e. The module 44 may thus be slid onto the meter housing 1, lockingly to engage therewith until pins 47 of an electrical connector 48 engage with complementary sockets in the access port 38 of the housing 1, whereby the module is arranged to make contact with the conductors 40, 41 and 42 as shown in FIG. 1f, the conductor 40 and the terminal 25 being arranged to carry heady load current. Additionally, a switch actuator pin 49 enters the access aperture 43, as shown in FIG. 1e, so that the switch 26 may be operated by the module 44. It is arranged that the optical interface 35 in the housing 1 aligns with a corresponding optical interface 50 in the module 44 when the module is fitted to the housing.

The module 44 may be arranged to perform a number of functions in accordance with the facilities required, electronic circuitry being provided to satisfy the requirement. For example, the module 44 may be designed to serve as a pre-payment module wherein input apertures 51 and 52 are provided for card-keys, smart-keys, smart-cards or memory-keys. Such a system is shown in the schematic block diagram of FIG. 2g wherein a customer interface unit 53 is provided for a card-key or a smart-card or the like. Input signals from the interface unit 53 are fed to a micro processor 54 which provides signals for a display 55, an opto port 56, a pulsed LED 57 and a solenoid driver 58. A dc power supply 59 is provided for operating the various parts of the module. The solenoid driver 58 is arranged to operate a solenoid 60 (or an alternative electro-mechanical device, to perform a similar function) in accordance with signals provided from the micro processor 54 to control operation of the switch 26 by appropriate operation of the actuator pin 49. Thus it may be arranged that when a predetermined quantity of electricity has been supplied to a consumer, as determined by insertion of a key-card or smart-card or the like, into the customer interface unit 53, the switch 26 will be operated thereby to interrupt the electricity supply to the consumer.

Figure 2A:
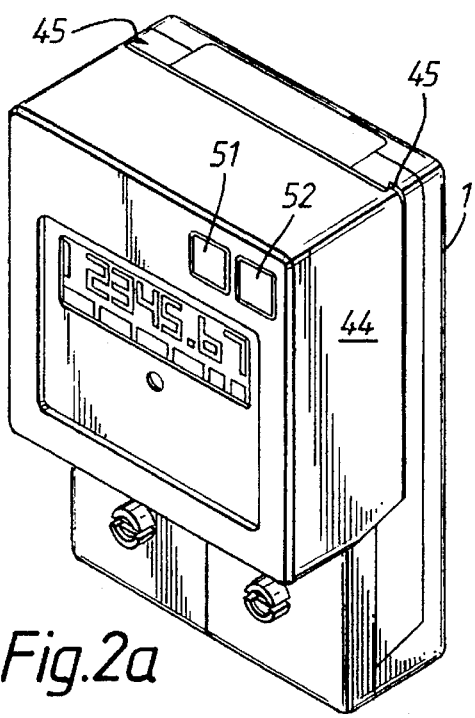
FIG. 2a is an isometric view of an assembly comprising the meter as shown in FIGS. 1a to 1e with a module unit fitted thereto.
Figure 2B:
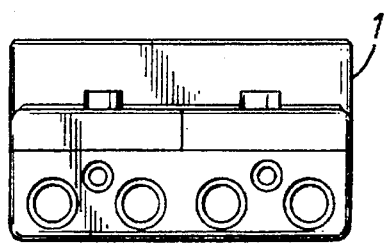
Figure 2C:
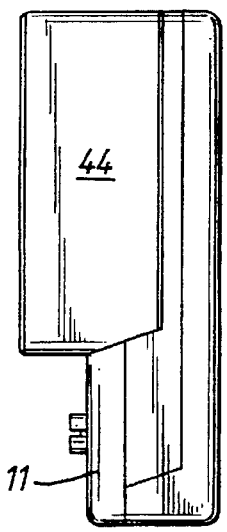
Figure 2D:
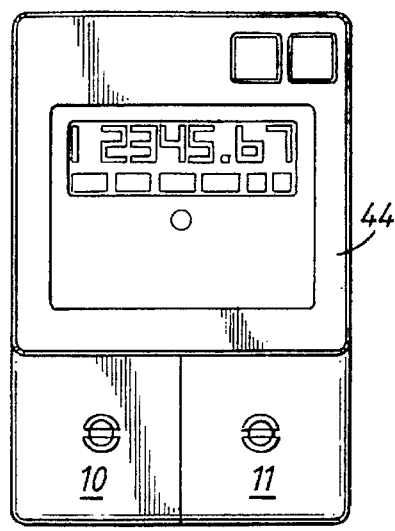
Figure 2E:
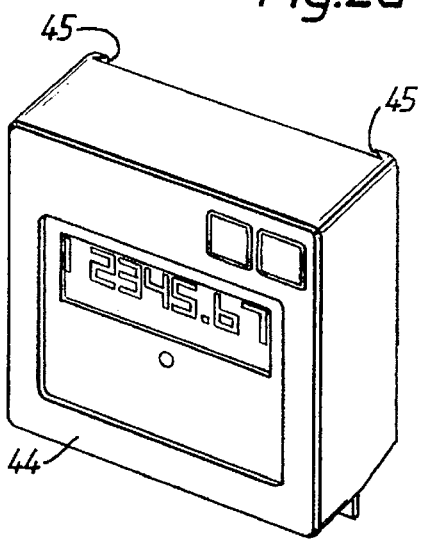
Figure 2F:
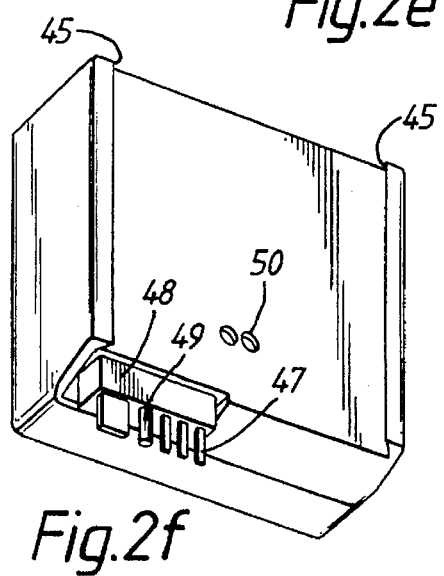
FIG. 2f is an underside perspective view of the module shown in FIG. 2e.
Figure 2G:
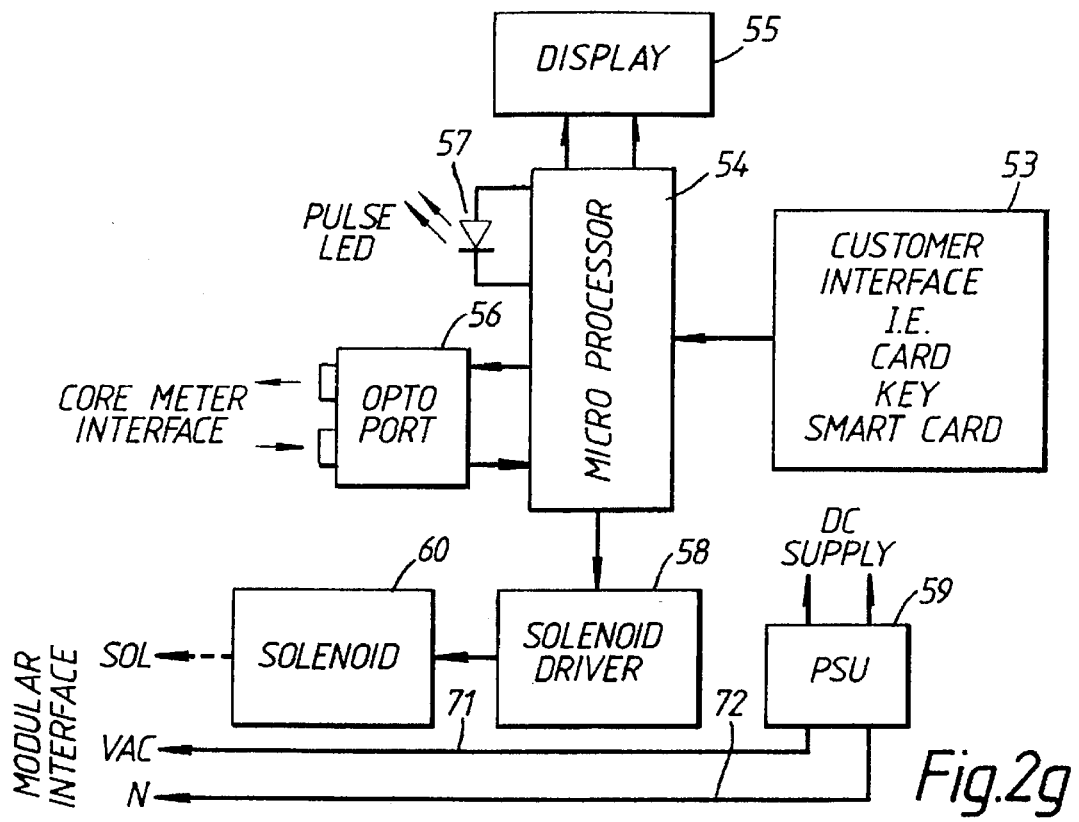
FIG. 2g is a schematic block circuit diagram of the module shown in FIG. 2f as used for pre-payment purposes.
Figure 2H:
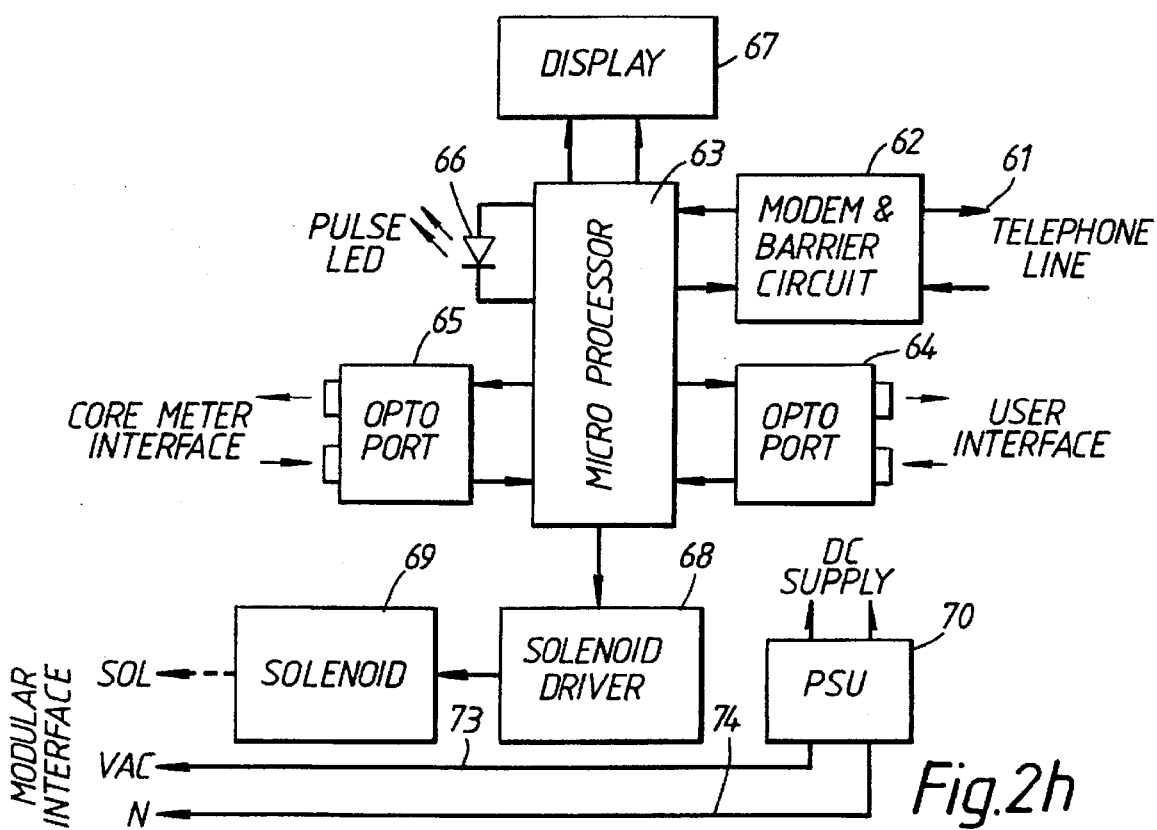
FIG. 2h is a schematic block circuit diagram of the module shown in FIG. 2f as used as a telephone module.

In an alternative arrangement, the module 44 may be provided with electronic circuitry corresponding to the circuitry as shown in the block schematic diagram of FIG. 2h. In this arrangement, the module 44 is connected to telephone lines 61 via a modem 62, which feeds a micro processor 63. A micro processor 63 is fed from a user interface opto port 64 and a meter interface opto port 65 as well as from a pulsed LED 66. Information appertaining to electricity used is indicated by a display 67. As will be appreciated by those skilled in the art the functionality of the unit will be determined in accordance with the application required and for example, the meter may be remotely interrogated to determine the quantity of electricity used to provide for automatic billing. Additionally, or alternatively, applied signals from the telephone line 61 may be fed via the micro processor to control a solenoid driver 68, in accordance with the quantity of electricity used for example, whereby a solenoid 69 is activated so as to operate the switch 26 for the purpose of connecting or disconnecting a consumer as the case may be. A dc supply unit 70 is provided which provides operating power for the solenoid driver in the micro processor, the display and other parts of the circuitry as required. It will be appreciated that electrical communication between the unit shown in FIG. 2g and the conductors 41 and 42 will be via conductors 71 and 72 respectively, and similarly the arrangement of FIG. 2h is fed via conductors 73 and 74.

For a better understanding of the manner in which solenoids 60 and 69 (which may be other equivalent electro-mechanical devices) in FIGS. 2g and 2h respectively operate the switch 26, further explanation will now be provided with reference to FIGS. 3a to 3d.

Figure 3A:
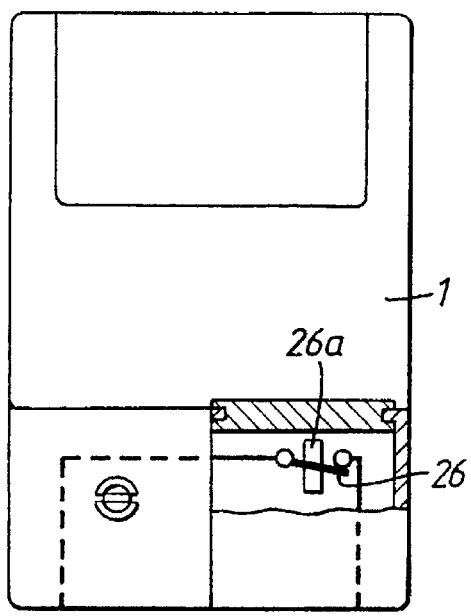
FIG. 3a is a front view of the meter which is a part of the assembly as shown in FIGS. 2a, 2b, 2c and 2d, and which includes a cut away portion to reveal a switch.
Figure 3C:
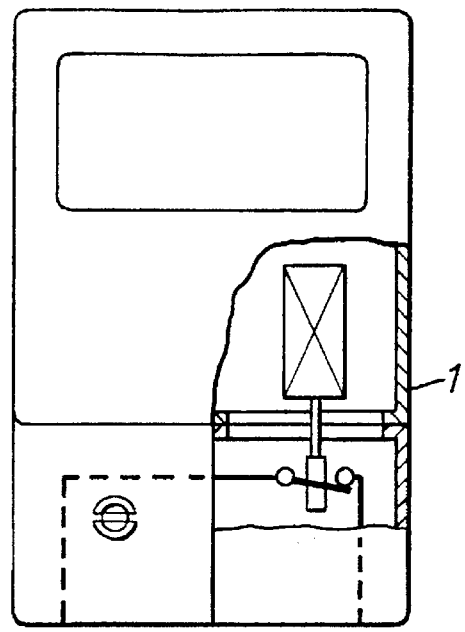
FIG. 3c is a front view of the assembly shown in FIG. 2a having a cut away portion to reveal a switch and an associated actuator.
Figure 3B:
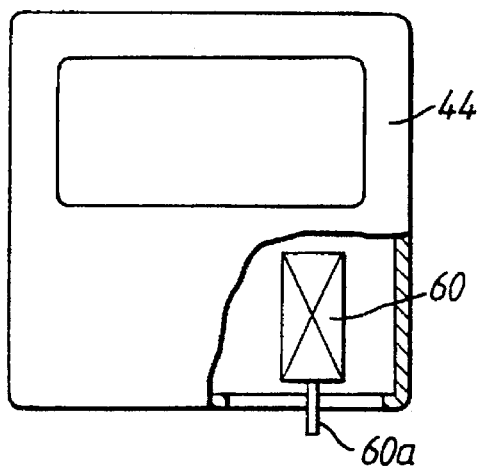
FIG. 3b is a front view of a module unit forming a part of the assembly shown in FIGS. 2a, 2b, 2c and 2d, which includes a cut away portion to reveal a switch actuator.
Figure 3D:
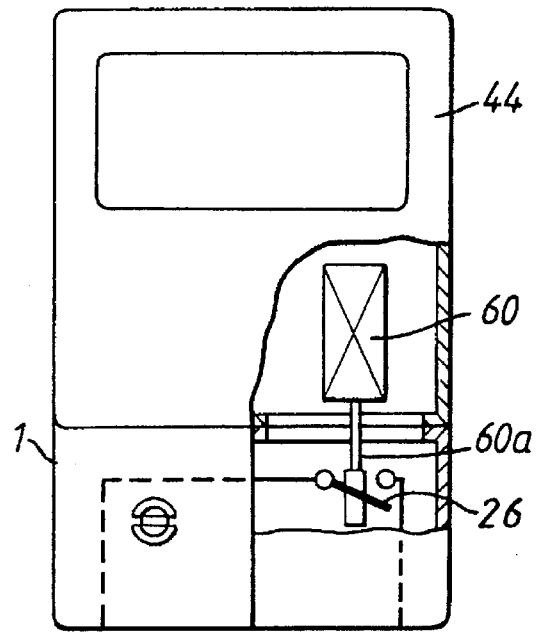
FIG. 3d is a front view of the assembly shown in FIG. 2g with the switch in a different position.
Figure 4A:
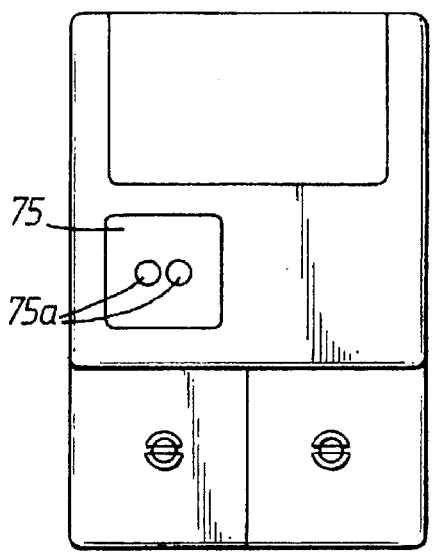
Figure 4C:
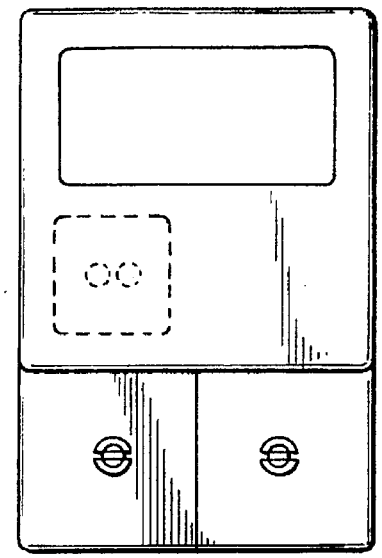
FIG. 4c is a front view of an assembly comprising the meter shown in FIG. 4a having the module shown in FIG. 4b fitted thereto.
Figure 4B:
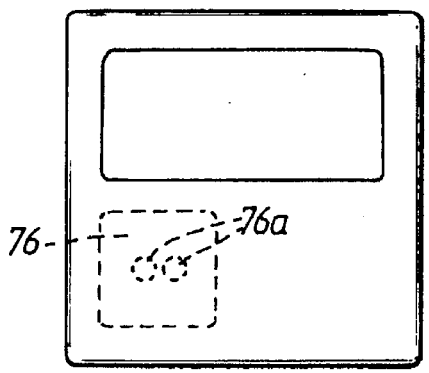
FIG. 4b is a front view of a module for use with the meter shown in FIG. 4a showing an optical interface.
Figure 4D:
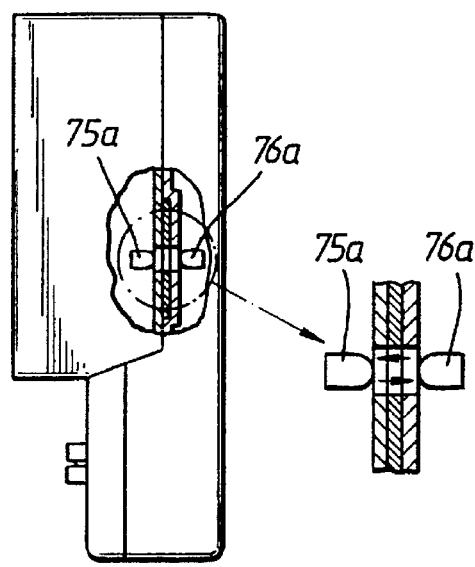
FIG. 4d is a side view of the assembly shown in FIG. 4c together with an enlarged view of an optical interface which forms a part of the assembly.
Figure 5A:
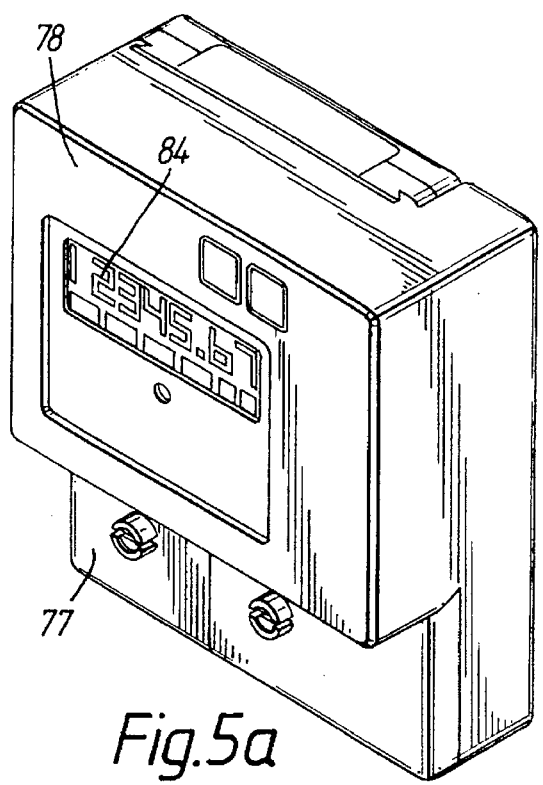
FIG. 5a is an isometric view of an assembly comprising meter and a radio receiver and load switching module.
Figure 5C:
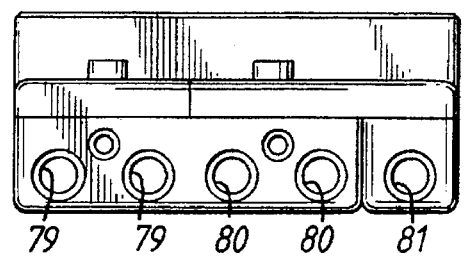
Figure 5B:
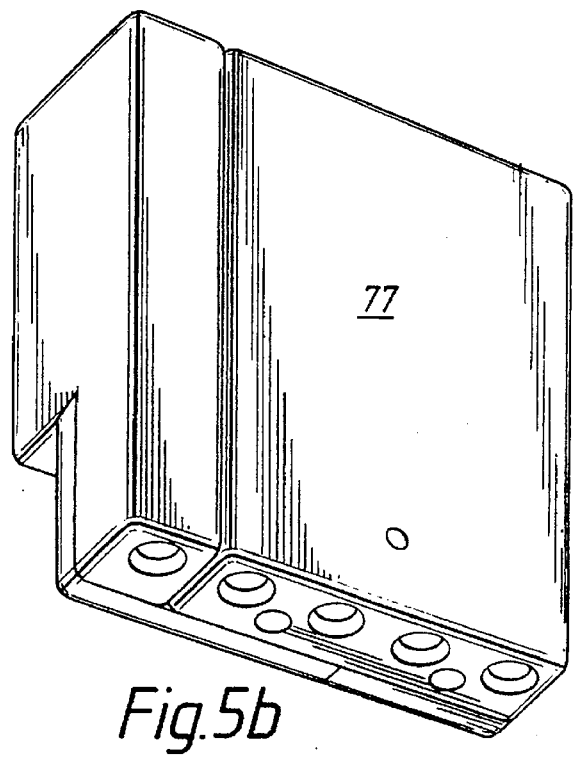
Figure 5D:
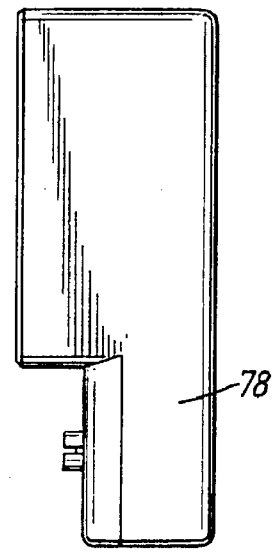
Figure 5E:
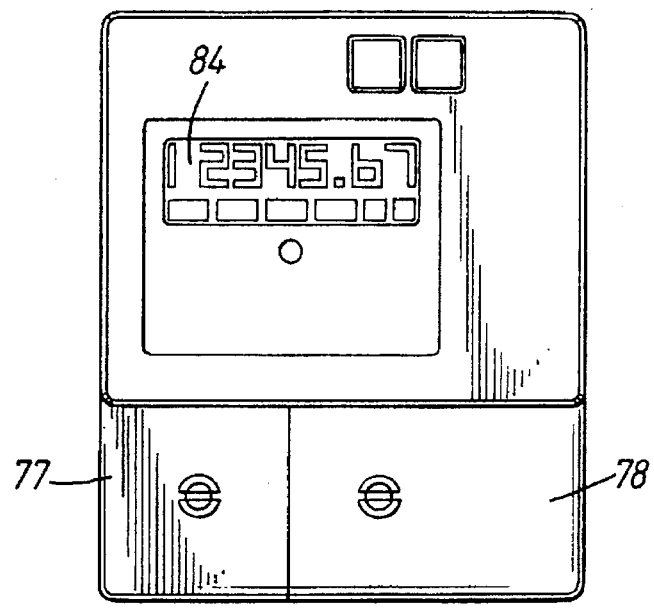
FIG. 5e is a front view of a module which form a part of the assembly shown in FIGS. 5a to 5d.
Figure 5F:
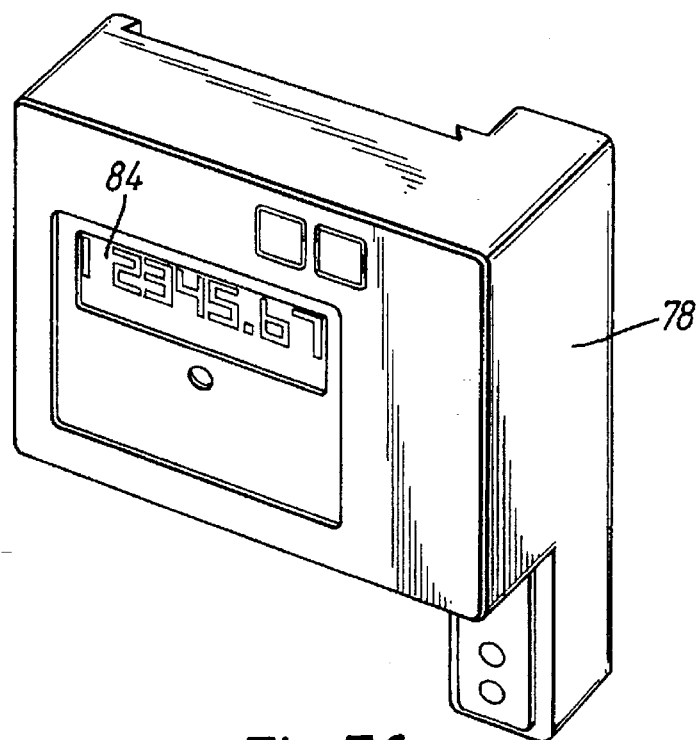
Figure 5G:
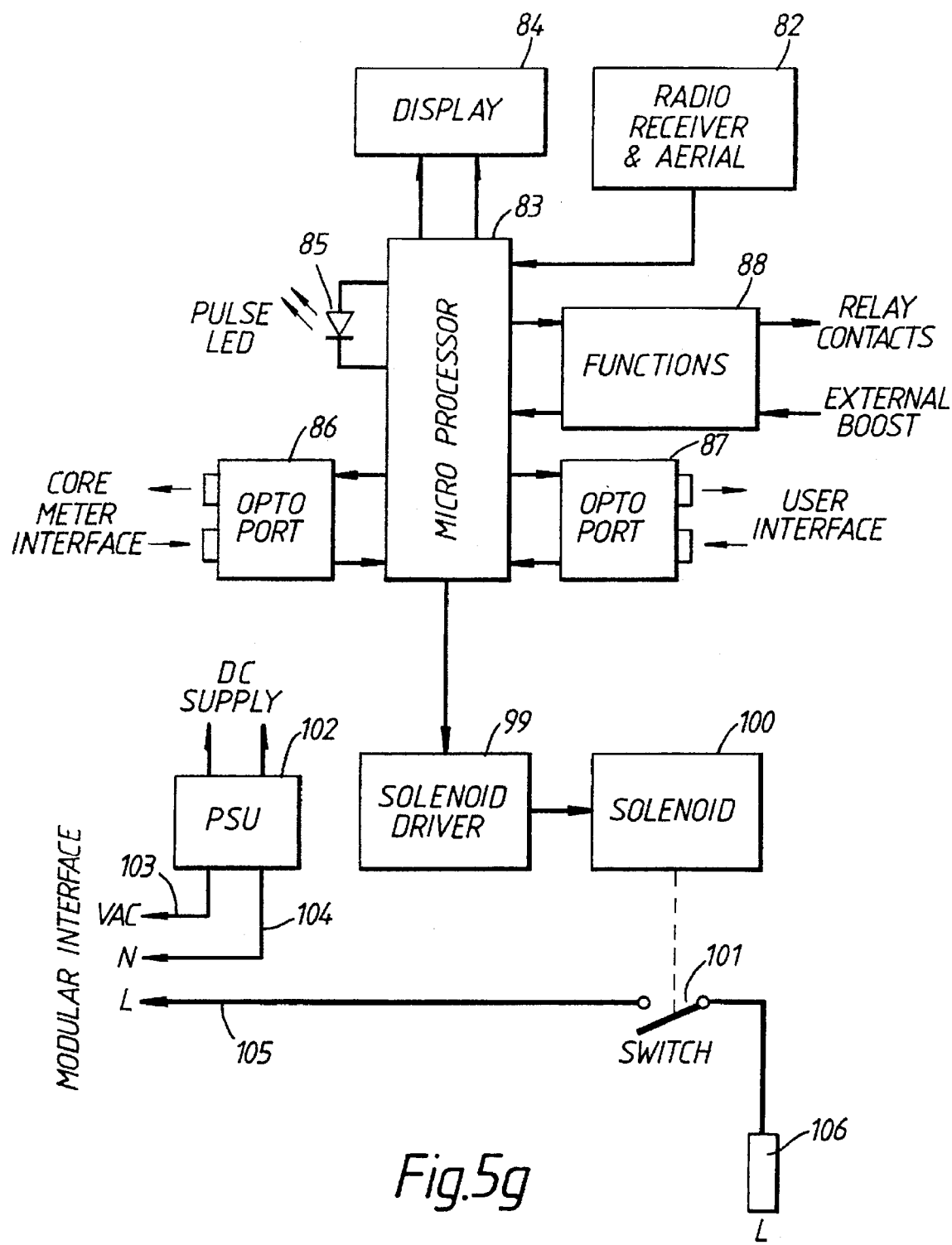

Referring now to FIG. 3a, the meter comprising the housing 1 includes a switch assembly which includes the switch 26 having associated with it the access aperture 43 as shown in FIG. 1e for the actuator pin 49. As shown in FIG. 3b the module 44, as shown in FIG. 2a, includes a solenoid corresponding to the solenoid 60 for example, having an actuator pin 60a. When the unit 44 is fitted to the housing 1, the actuator pin 60a aligns with the actuator 26a as shown in FIG. 3c, whereby when the solenoid 60 is energised, the pin 60a is constrained to open the switch 26.

In order to facilitate a better understanding of the arrangement of the opto couplers in the housing 1, and the unit 44, reference will now be made to FIGS. 4a to 4d, wherein it can be seen that an opto port corresponding to the opto port 35 of FIG. 1a is arranged to align with the opto port 50 of a module unit as shown in FIG. 2f and thus an opto coupler 75 aligns with a corresponding opto coupler 76, so that active elements 75a and 76a respectively align to facilitate the transmission of light therebetween.

Although as hereinbefore described, the module unit may be arrange to operate a switch which is contained in the meter, alternatively, or additionally, the module unit may include its own switch as will now be described with reference to FIGS. 5a to 5g, wherein corresponding parts bear the same numerical designations.

Referring firstly to FIGS. 5a to 5f, a meter assembly comprises a meter housing 77 to which a radio module 78 is fitted having apertures 79 and 80 for input and output cables respectively, but additionally, the module unit provides an additional output aperture 81 for a further output conductor. The unit is arranged to include a radio receiver module 82, as shown in the circuit diagram, FIG. 5g, which feeds a micro processor 83 connected to a display unit 84. As hereinbefore described, the micro processor feeds pulsed LED 85 and opto ports 86 and 87, data appertaining to additional functions being fed to the micro processor via a miscellaneous functions circuit 88. In operation, the meter may be switched in dependence upon received radio signals via the micro processor 83 which appropriately operates a solenoid driver 99 which feeds a solenoid 100. Operation of the solenoid causes a switch 101 to operate so as to connect or disconnect as the case may be, power to a conductor 106 which enters the additional port 81. In order to provide power to the various units, a dc power supply 102 is provided, electrical connection between the module unit 78 and parts within the meter housing 77 being made as hereinbefore described via conductors 103, 104 and 105.

In the present example the switch 101 corresponds to the switch 26, shown in FIG. 1f, but in alternative arrangements, a further switch may be provided in the radio module which may be arranged to be independently operated.

It will be appreciated that the foregoing embodiments are given by way of example only, and that various modifications may be made as will be appreciated by those skilled in the art, without departing from the scope of the invention.

I claim:

1. An electricity meter comprising:
   input terminals to which in use a mains electricity supply is connected,
   output terminals via which in use electricity is fed to a consumer, and
   a switch via which electricity is fed from the input terminals to the output terminals and metering means operative to provide an indication of the quantity of electricity fed via the switch to the consumer, the meter being adapted to receive a unit arranged in operative association with the switch so as to effect operation of a switch actuator to open the switch for the purpose of interrupting the supply of electricity to the consumer consequent upon receipt by the unit of a predetermined actuation signal, wherein the switch actuator forms a part of the unit and is arranged to cooperate mechanically with a switch assembly in the meter of which the switch forms a part, so as to effect operation of the switch consequent upon receipt by the unit of said actuation signal.

2. A meter as claimed in claim 1, including the unit.

3. A meter as claimed in claim 1, wherein the switch actuator is responsive to a further predetermined signal for effecting switch operation so that the supply is connected/reconnected to the consumer.

4. A meter as claimed in claim 2, wherein the unit is electrically coupled to the meter for the purpose of receiving signals therefrom indicative of the quantity of electricity used.

5. A meter as claimed in claim 2, wherein the unit is optically coupled to the meter for the purpose of receiving signals therefrom indicative of the quantity of electricity used.

6. A meter as claimed in claim 2, wherein the unit includes a display which provides an indication of electricity supplied to the consumer as measured by the meter.

7. A meter as claimed in claim 2, wherein the unit includes its own display and measurement facilities.

8. A meter as claimed in claim 2, wherein the unit is adapted to facilitate the use of a display which forms a part of the meter for providing an indication of the quantity of electricity used by a consumer.

9. A meter as claimed in claim 2, wherein the unit is adapted to convert the meter to a pre-payment meter and is arranged to receive coins or tokens or the like, in dependence upon the provision of which coins or tokens, electricity is supplied via the switch to the consumer, the unit being arranged to deliver the actuation signal to effect switch operation for the purpose of interrupting the supply of electricity to the consumer when a quantity of electricity appropriate to the value of coins or tokens received has been used by the consumer.

10. A meter as claimed in claim 2, wherein the unit is arranged to facilitate remote meter reading.

11. A meter as claimed in claim 10, wherein the unit includes for the purpose of facilitating remote meter reading a line communication interface.

12. A meter as claimed in claim 10, wherein the unit includes for the purpose of facilitating remote meter reading a radio communication interface.

13. A meter as claimed in claims 2, wherein a line communication interface is provided for effecting remote operation of the switch.

14. A meter as claimed in claim 2, wherein a radio communication interface is provided for effecting remote operation of the switch.

15. A meter as claimed in claim 2, wherein the unit includes a further switch via which additional output terminals are fed.

16. A meter as claimed in claim 15, wherein the said further switch is controllable locally by means of a clock.

17. A meter as claimed in claim 1, wherein the said switch is locally controllable by means of a clock.

* * * * *